United States Patent
Koshikawa

[19]

[11] Patent Number: 6,154,080
[45] Date of Patent: *Nov. 28, 2000

[54] SEMICONDUCTOR MEMORY DEVICE WITH PLURAL TRIGGER CIRCUITS FOR DATA OUTPUT

[75] Inventor: Yasuji Koshikawa, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/213,251

[22] Filed: Dec. 17, 1998

Related U.S. Application Data

[62] Division of application No. 09/008,576, Jan. 16, 1998, Pat. No. 5,881,019.

[30] Foreign Application Priority Data

Jan. 17, 1997 [JP] Japan ..................................... 9-020012

[51] Int. Cl.[7] ....................................................... H03K 3/00
[52] U.S. Cl. ............................................. 327/291; 327/293
[58] Field of Search ..................................... 327/115, 117, 327/118, 291, 293, 295; 377/47, 48

[56] References Cited

U.S. PATENT DOCUMENTS

| | | | |
|---|---|---|---|
| 5,341,031 | 8/1994 | Kinoshita et al. | 327/115 |
| 5,579,267 | 11/1996 | Koshikawa | 365/189.05 |
| 5,691,955 | 11/1997 | Yamauchi | 365/233 |
| 5,740,121 | 4/1998 | Suzuki et al. | 365/233 |
| 5,774,007 | 6/1998 | Soneda | 327/292 |
| 5,812,835 | 9/1998 | Ruuskanen | 395/558 |
| 5,821,643 | 10/1998 | Mandelcorn | 327/82 |

FOREIGN PATENT DOCUMENTS

| | | |
|---|---|---|
| 61-148692 | 7/1986 | Japan . |
| 2-25068 | 1/1990 | Japan . |
| 6-76566 | 3/1994 | Japan . |
| 8-96573 | 4/1996 | Japan . |
| 8-212778 | 8/1996 | Japan . |

*Primary Examiner*—Kenneth B. Wells
*Attorney, Agent, or Firm*—Foley & Lardner

[57] ABSTRACT

In a synchronous semiconductor memory device including a memory cell array, a burst counter for generating an internal address signal in synchronization with an external clock signal and a decoder for reading out data from the memory cell array according to the internal address signal, an internal clock generation circuit generates an internal clock signal having a frequency equal to ½ of the frequency of the external clock signal in synchronization with the external clock signal, and a data output circuit outputs the data read out of the memory cell array in synchronization with both a rising edge and a falling edge of the internal clock signal.

3 Claims, 8 Drawing Sheets

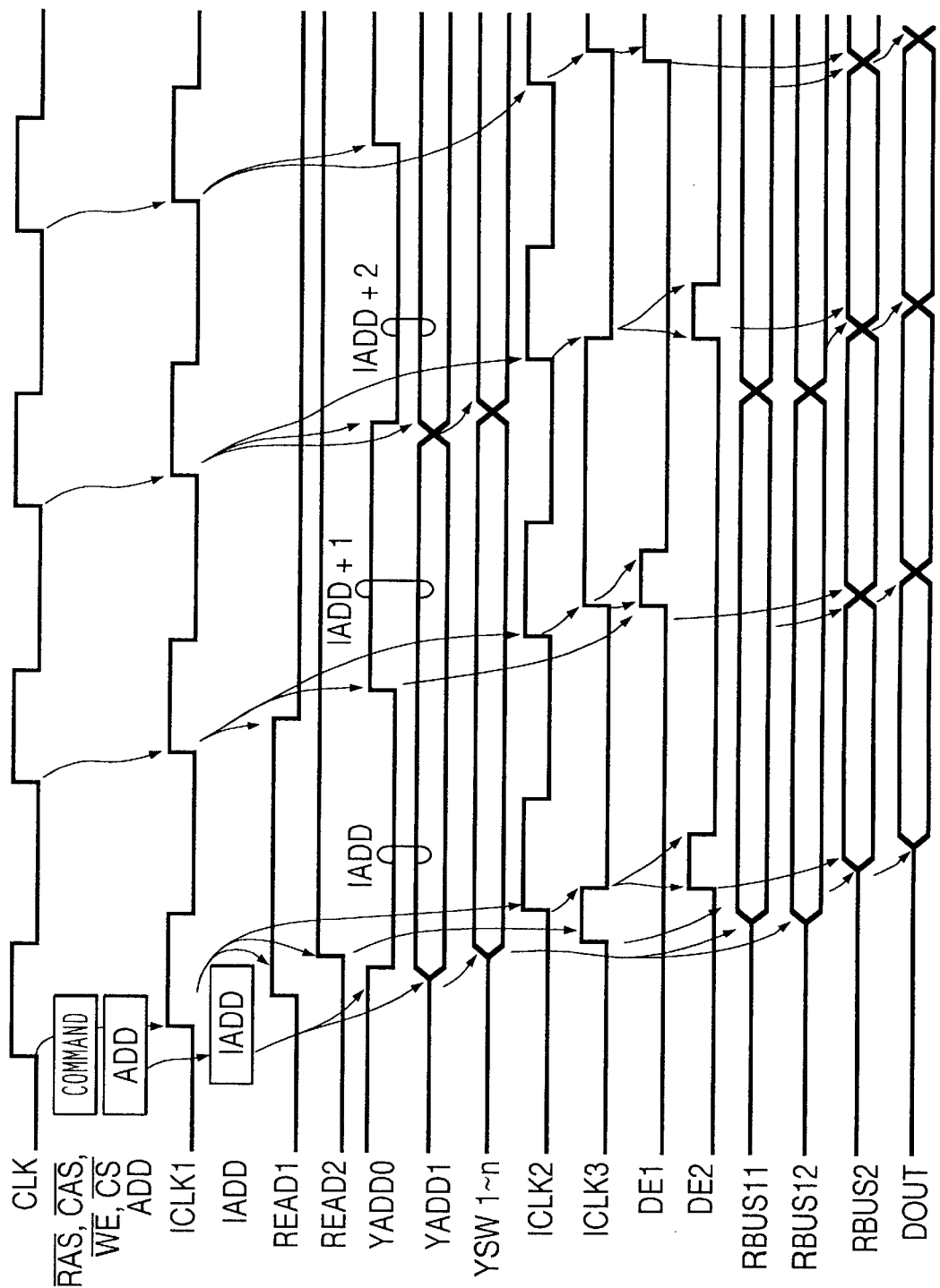

SEMICONDUCTOR MEMORY DEVICE WITH PLURAL TRIGGER CIRCUITS FOR DATA OUTPUT

This application is a divisional of application Ser. No. 09/008,576, filed Jan. 16, 1998 now U.S. Pat. No. 5,881,019.

BACKGROUND OF THE INVENTION

1. Field of the Invention

The present invention relates to a synchronous semiconductor memory device and, more particularly, it relates to an improvement on a heavily loaded signal line that is adapted to operate at a high frequency.

2. Description of the Related Art

In recent years, under the circumstances where microprocessors are designed to operate at high speed, there is a strong demand for dynamic random access memory (DRAM) devices operating as main memories that offer a high access speed exceeding 100 MHz. In an attempt to meet the demand, a number of synchronous semiconductor memory devices have been developed (see: JP-A-61-148692, JP-A-6-76566 & JP-A-8-96573). A synchronous semiconductor memory device latches an external address with a data write/read instruction and executes the operation of reading/writing the data at the external address and then it receives a synchronous clock signal and generates predetermined internal addresses starting from the external address to read/write the data at the internal addresses. Thus, a synchronous DRAM is a DRAM device that operates in synchronization with a clock signal, so that the data with the addresses that are internally and automatically generated following the data at the address latched by a read/write instruction are continuously output at high speed or data are input to the addresses continuously at high speed. This is called a burst operation.

In a prior art synchronous semiconductor memory device including a memory cell array, a burst counter for generating an internal address signal in synchronization with an external clock signal and a decoder for reading out data from the memory cell array according to the internal address signal, an internal clock generation circuit generates an internal clock signal having a frequency equal to the frequency of the external clock signal, and a data output circuit outputs the data read out of the memory cell array in synchronization with the internal clock signal. This will be explained later in detail.

In the above-described prior art synchronous DRAM device, however, the internal clock signal operates at the same frequency as that of the external clock signal, so that the life span of a signal line for the internal clock signal is reduced by deterioration of its reliability due to electromigration.

SUMMARY OF THE INVENTION

It is an object of the present invention to reduce the load of a signal line for an internal clock signal in a synchronous semiconductor memory device.

According to the present invention, in a synchronous semiconductor memory device including a memory cell array, a burst counter for generating an internal address signal in synchronization with an external clock signal and a decoder for reading out data from the memory cell array according to the internal address signal, an internal clock generation circuit generates an internal clock signal having a frequency equal to ½ of the frequency of the external clock signal in synchronization with the external clock signal, and a data output circuit outputs the data read out of the memory cell array in synchronization with both a rising edge and a falling edge of the internal clock signal.

Alternatively, a memory cell array is divided into at least first and second blocks. A first data output means outputs the data read out of the first block of the memory cell array in synchronization with a rising edge of the internal clock signal, and a second data output means outputs the data read out of the second block of the memory cell array in synchronization with a falling edge of the internal clock signal.

BRIEF DESCRIPTION OF THE DRAWINGS

The present invention will be more clearly understood from the description as set forth below, as compared with the prior art, with reference to the accompanying drawings, wherein:

FIGS. 8A through 8R are timing charts for showing the operation of the device of FIG. 7.

DESCRIPTION OF THE PREFERRED EMBODIMENTS

Before the description of the preferred embodiments, prior art synchronous DRAM devices will be explained with reference to FIGS. 1, 2A through 2N, 3 and 4A through 4R.

Figure 1:
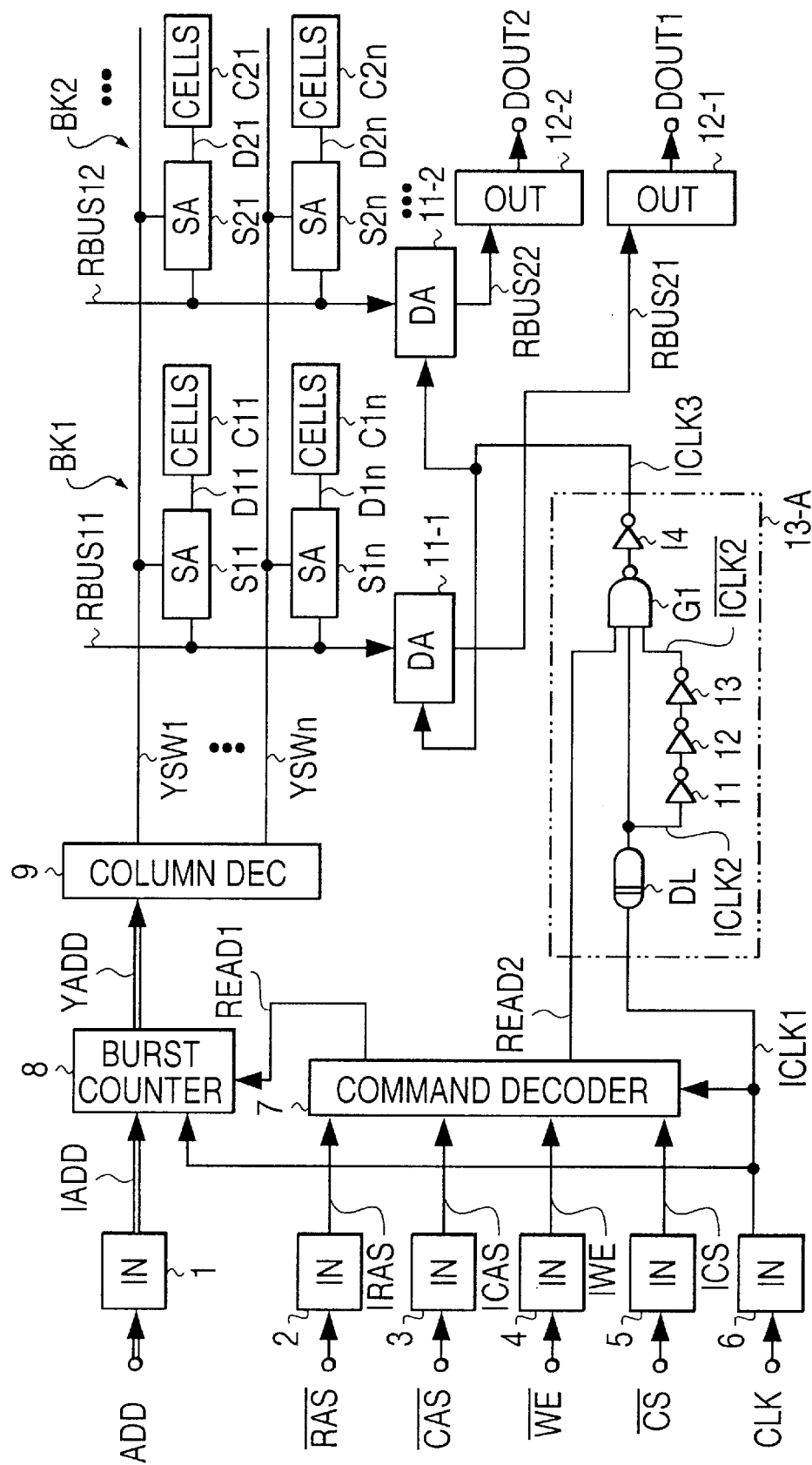
FIG. 1 is a block circuit diagram illustrating a first prior art synchronous DRAM device.

In FIG. 1, which illustrates a first prior art synchronous DRAM device, an input circuit 1 receives an external address signal ADD and outputs an internal address signal IADD. An input circuit 2 receives a row address strobe signal $\overline{RAS}$ and outputs an internal signal IRAS, and an input circuit 3 receives a column address strobe signal $\overline{CAS}$ and outputs an internal signal ICAS. Similarly, an input circuit 4 receives a write enable signal $\overline{WE}$ and outputs an internal signal IWE and an input circuit 5 receives a chip select signal $\overline{CS}$ and outputs an internal signal ICS, whereas an input circuit 6 receives an external clock signal CLK and outputs an internal clock signal ICLK1. Note that the input circuits 2 through 5 operate at a rising edge of the external clock signal CLK.

A command decoder 7 receives the internal signals IRAS, ICAS, IWE and ICS and outputs signals READ1 and READ2 in synchronization with the internal clock signal ICLK1.

A burst counter 8 latches the internal address signal IADD according to the signal READ1 and counts up the latched internal address signal IADD according to the internal clock signal ICLK1 to automatically generate a column address signal YADD. A column decoder 9 receives the column address signal YADD and sequentially selects column switch lines YSW1 through YSWn.

Sense amplifiers S11, S21, ..., S1n, S2n, are connected between the column switch lines YSW1, ..., YSWn and read buses RBUS11, RBUS12, .... For example, if the column switch line YSW1 is selected, the sense amplifiers S11, S21, ... output data to the read buses RBUS11, RBUS12, .... On the other hand, cell columns C11, C21, ..., C1n, C2n, ... are connected to the sense amplifiers S11, S21, ..., S1n, S2n, ... by way of digit lines D11, D21, ..., D1n, D2n, ..., respectively. Note that each of the cell columns C11, C21, ..., C1n, C2n, ... represents a plurality of cells which are selected by a row decoder (not shown). For example, while a cell array is divided into m blocks BK1, BK2, ..., only two of them, or blocks BK1 and BK2 are shown for simplicity.

The read buses RBUS11, RBUS12, ... are respectively connected to data amplifiers 11-1, 11-2, ..., which are connected by turn to read buses RBUS21, RBUS22, .... The read buses RBUS21, RBUS22, ... are then connected to output circuits 12-1, 12-2, ..., which are connected by turn to output terminals DOUT1, DOUT2, ..., respectively.

The data amplifiers 11-1, 11-2, ... are controlled by an internal clock generation circuit 13-A. More specifically, the internal clock generation circuit 13-A receives the signal READ2 from the command decoder 7 and outputs an internal clock signal ICLK3 that is synchronized with the internal clock signal ICLK1.

The internal clock generation circuit 13-A is formed by a delay circuit DL that delays the internal clock signal ICLK1 and outputs an internal clock signal ICLK2, inverters I1, I2 and I3 that invert and delay the internal clock signal ICLK2, a NAND circuit G1 that receives the internal clock signal ICLK2 and its inverted and delayed signal $\overline{ICLK2}$, and an inverter I4. The NAND circuit G1 also receives the signal READ2. Therefore, the internal clock generation circuit 13-A is enabled only when the signal READ2 is high. In other words, the internal clock generation circuit 13-A outputs the internal clock signal ICLK3 that is synchronized with the internal clock signal ICLK1 when the signal READ2 is high.

Now, the operation of the synchronous DRAM device of FIG. 1 will be explained with reference to FIGS. 2A through 2N.

Figure 2:
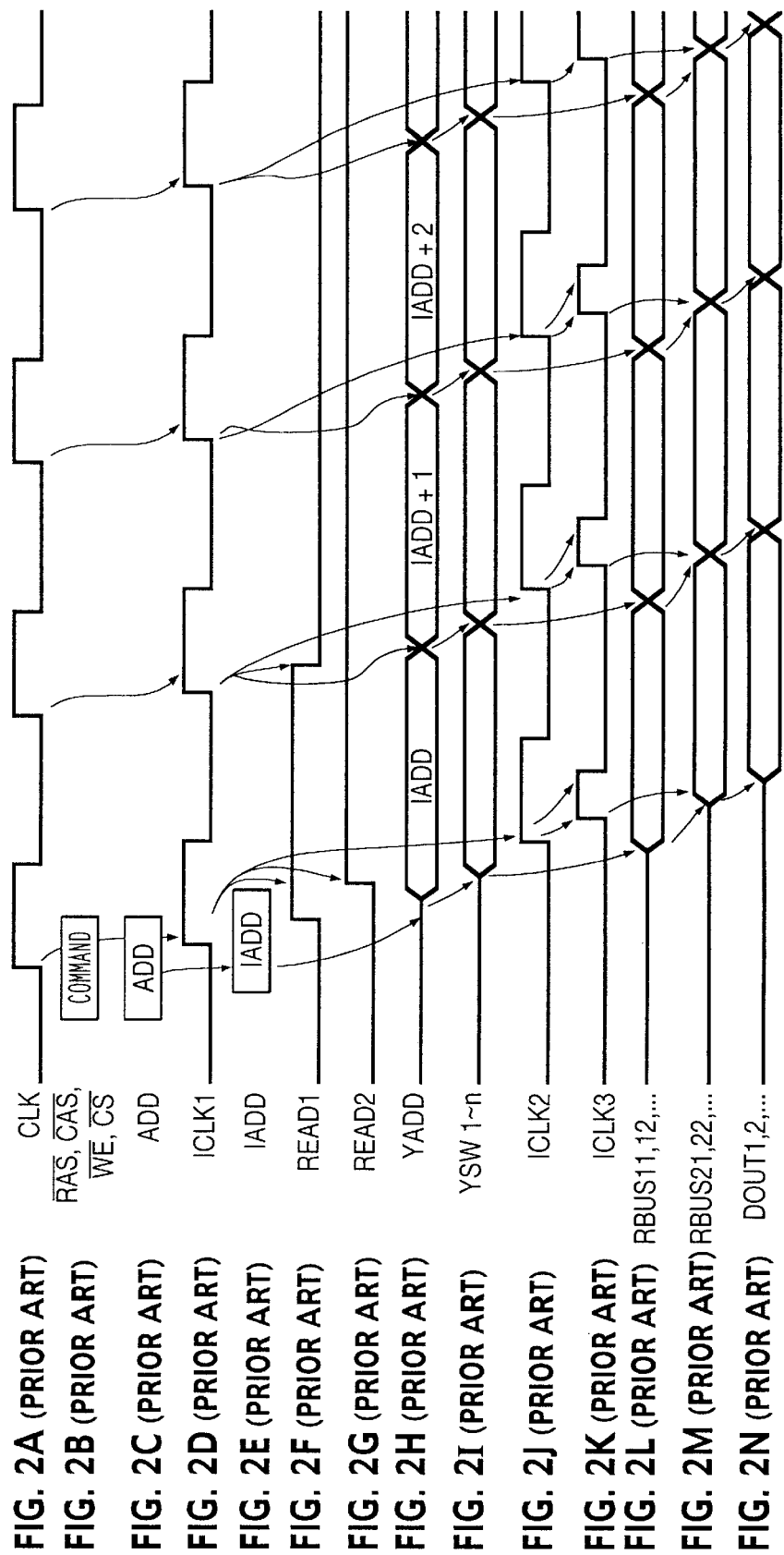
FIGS. 2A through 2N are timing charts for showing the operation of the device of FIG. 1.

Assume that an external clock signal CLK is input as indicated in FIG. 2A and, as a result, signals $\overline{RAS}$, $\overline{CAS}$, $\overline{WE}$ and $\overline{CE}$ are input at a rising edge of the external clock signal CLK to show a read command as indicated by FIG. 2B. In this case, as shown in FIG. 2D, the internal clock signal CLK1 is generated in synchronization with the external clock signal CLK, and also, an external address signal ADD as shown in FIG. 2C becomes an internal address signal IADD as shown in FIG. 2E.

Upon receiving the read command, the command decoder 7 outputs high level signals READ1 and READ2 as shown in FIGS. 2F and 2G in synchronization with the internal clock signal ICLK1. The signal READ1 is brought to a low level in synchronization with the next rising edge of the internal clock signal ICLK1.

Upon receiving the high level signal READ1, the burst counter 8 latches and outputs the internal address signal IADD as shown in FIG. 2H. Thereafter, the signal READ1 goes to a low level, so that the burst counter 8 proceeds to a burst operation, where it generates IADD+1, IADD+2, ... in synchronization with the internal clock signal ICLK1. More specifically, a column address signal YADD is changed to IADD, IADD+1, IADD+2, ... and, as a result, the column decoder 9 sequentially selects the column switch lines that correspond to IADD, IADD+1, IADD+2, ..., respectively, as shown in FIG. 2I. Thus, as shown in FIG. 2L, data are output from the sense amplifiers that have amplified in advance cell data to the read buses RBUS11, RBUS12, ....

On the other hand, the internal clock generation circuit 13-A that receives the high level signal READ2 generates internal clock signal ICLK2 that is synchronized with the internal clock signal ICLK1, as shown in FIG. 2J, and outputs an internal clock signal ICLK3 that is synchronized with the internal clock signal ICLK2, as shown in FIG. 2K.

As a result, as shown in FIG. 2M, the data on the read bus RBUS11 (12, ... ) is output to the read bus RBUS21 (22, ... ) in synchronization with the internal clock signal ICLK3. Furthermore, as shown in FIG. 2N, the data on the read bus RBUS21 (22, ... ) is output to the output terminal DOUT1 (DOUT2, ... ).

Figure 3:
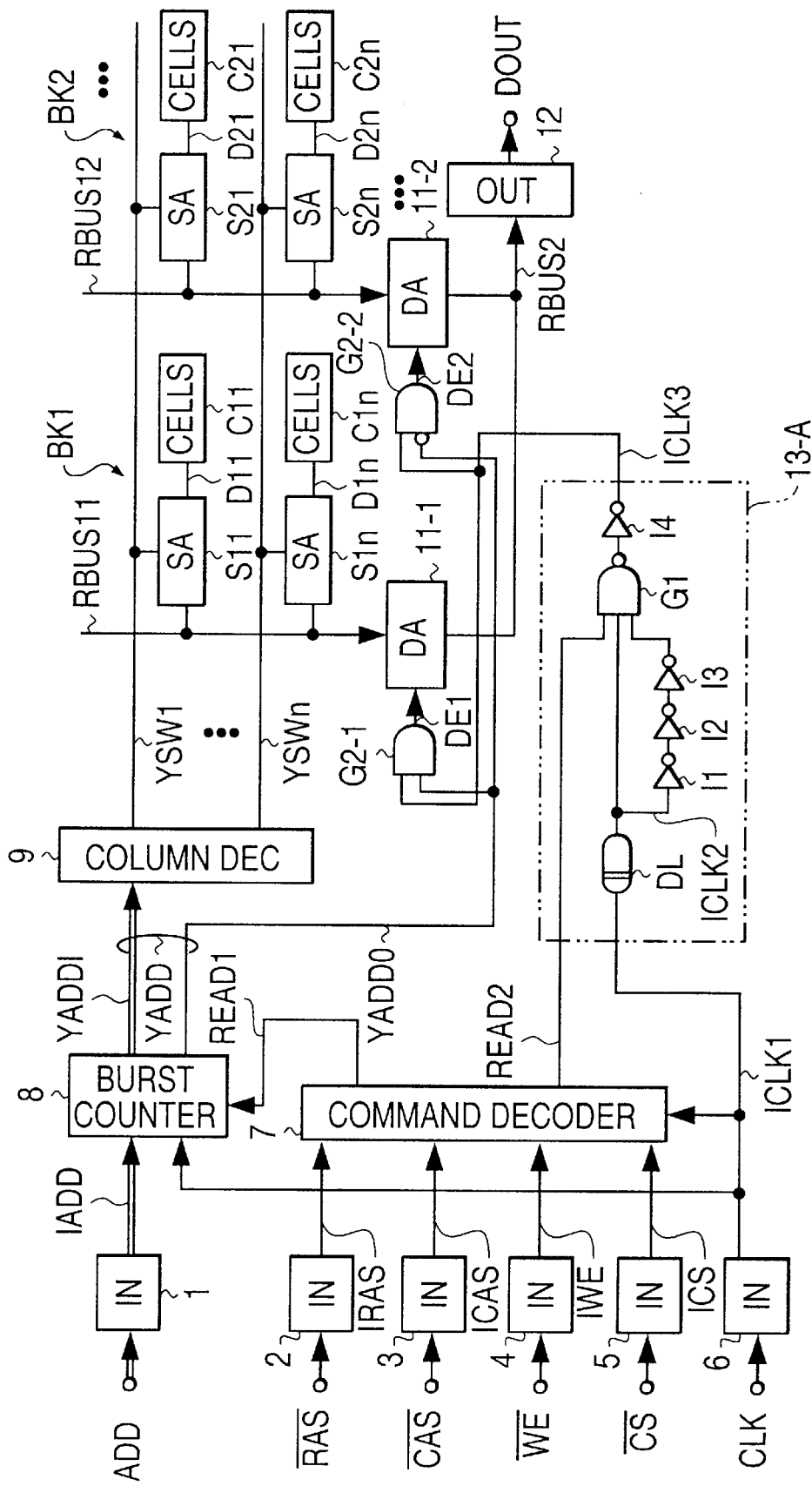
FIG. 3 is a block circuit diagram illustrating a second prior art synchronous DRAM device.

In FIG. 3, which illustrates a second prior art DRAM device, only two blocks BK1 and BK2 are also shown as a memory cell array for the purpose of simplicity.

The device of FIG. 3 has a number of output circuits that is equal to ½ of that of the device of FIG. 1. More specifically, the output circuits 12-1 and 12-2 of FIG. 1 correspond to an output circuit 12 in FIG. 3 and one of the data amplifiers 11-1 and 11-2 is selected before it is connected to the output circuit 12. Thus, the number of output terminals of FIG. 3 will be equal to ½ of that of FIG. 1.

In FIG. 3, the least significant bit of the output YADD of the burst counter 8 is made equal to YADD0 to select one of the data amplifiers 11-1 and 11-2, while the other bits of the output YADD are made equal to YADD1 so that only the column address signal YADD1 is fed to the column decoder 9. In other words, the column address signal YADD0 is fed to gate circuits G2-1 and G2-2, so that the internal clock signal ICLK3 is selected and fed to either the data amplifier 11-1 or 11-2.

Now, the operation of the synchronous DRAM device of FIG. 3 will be explained with reference to FIGS. 4A through 4R.

Figure 4:
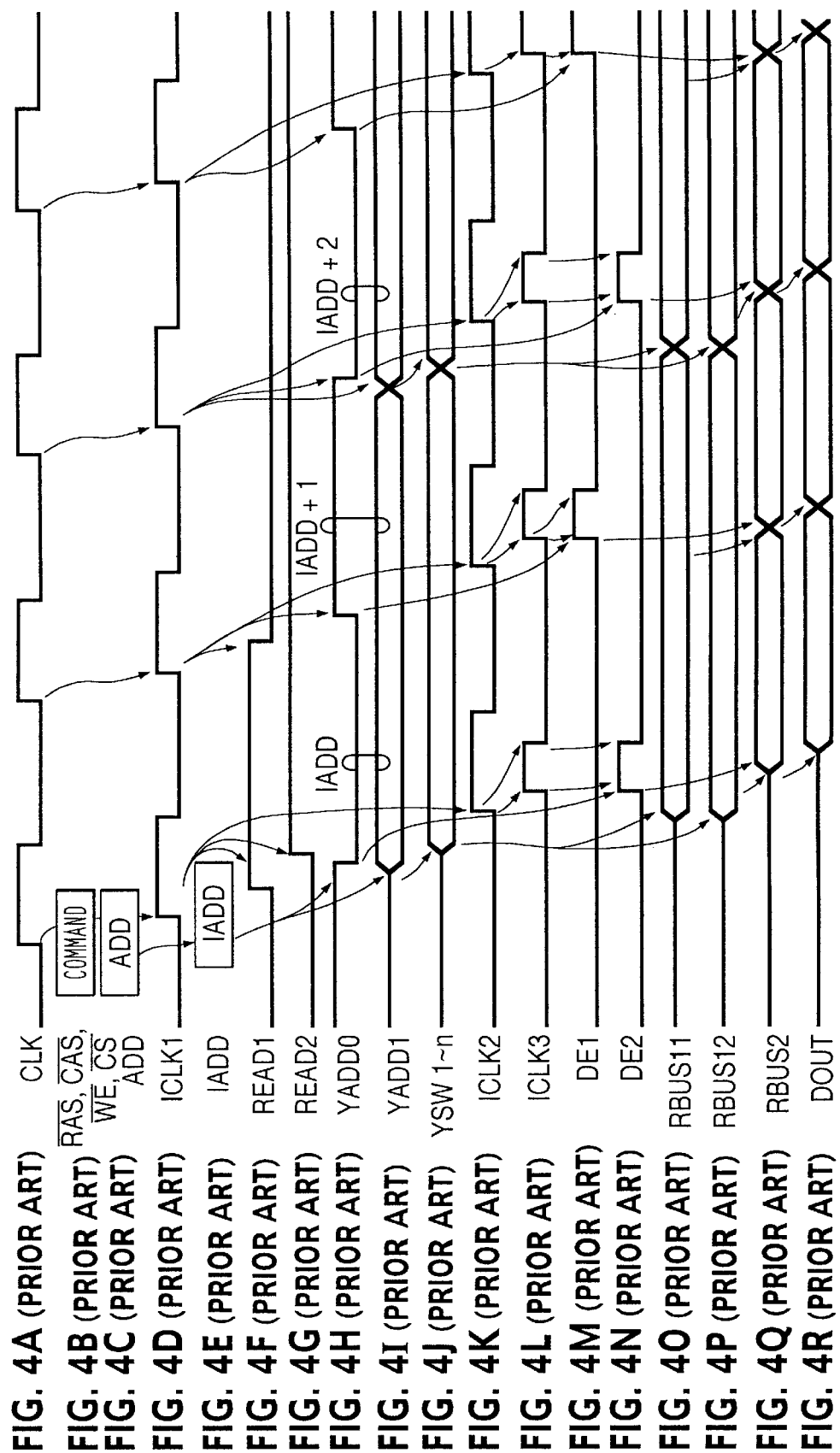
FIGS. 4A through 4R are timing charts for showing the operation of the device of FIG. 3.

Assume that an external clock signal CLK is input as shown in FIG. 4A and, as a result, signals $\overline{RAS}$, $\overline{CAS}$, $\overline{WE}$ and $\overline{CS}$ are input at a rising edge of the external clock signal CLK to show a read command as shown in FIG. 4B. In this case, as shown in FIG. 4D, an internal clock signal ICLK1 is generated in synchronization with the external clock signal CLK, and also, an external address signal ADD as shown in FIG. 4C becomes an internal address signal IADD as shown in FIG. 4E.

Upon receiving the read command, the command decoder 7 outputs high level signals READ1 and READ2 as shown in FIGS. 4F and 4G in synchronization with the internal clock signal ICLK1. The signal READ1 is brought to a low level in synchronization with the next rising edge of the internal clock signal ICLK1.

Upon receiving the high level signal READ1, the burst counter 8 latches and outputs an internal address signal IADD as shown in FIGS. 4H and 4I. Note that IADD is expressed in terms of (YADD0, YADD1). Thereafter, the signal READ1 goes to a low level, so that the burst counter 8 proceeds to a burst operation, where it generates IADD+1, IADD+2, ... in synchronization with the internal clock signal ICLK1. Also, note that IADD+1, IADD+2, ... are expressed in terms of (YADD0, YADD1). More specifically, a column address signal YADD is changed to IADD, IADD+

1, IADD+2, . . . , and, as a result, the column decoder 9 sequentially selects column switch lines that correspond to the addresses of IADD, IADD+1, IADD+2, . . . , except for the least significant bit, respectively, as shown in FIG. 4J. Thus, as shown in FIGS. 4O and 4P, data are output from the sense amplifiers that have amplified in advance cell data to the read buses RBUS11, RBUS12, . . . .

On the other hand, the internal clock generation circuit 13-A that receives the high level signal READ2 generates internal clock signal ICLK2 that is synchronized with the internal clock signal ICLK1, as shown in FIG. 4K, and outputs an internal clock signal ICLK3 that is synchronized with the internal clock signal ICLK2, as shown in FIG. 4L.

Then, the internal clock signal ICLK3 becomes data amplifier activation signal DE1 or DE2 according to the column address signal YADD0. More specifically, when YADD0 is high, the data amplifier activation signal DE1 goes to a high level in synchronization with the internal clock signal ICLK3 as shown in FIG. 4M, so that the data on the read bus RBUS11 is output to the read bus RBUS2 as shown in FIG. 4Q. On the other hand, when YADD0 is low, the data amplifier activation signal DE2 goes to a high level in synchronization with the internal clock signal ICLK3 as shown in FIG. 4N, so that the data on the read bus RBUS12 is output to the read bus RBUS2 as shown in FIG. 4Q.

Furthermore, as shown in FIG. 4R, the data on the read bus RBUS2 is output to the output terminal DOUT.

With any of the above-described prior art synchronous DRAM devices, the internal clock signal ICLK3 operates at the same frequency as that of the external clock signal CLK, so that the life span of a signal line for the internal clock signal ICLK3 is reduced by deterioration of its reliability due to electro-migration.

More specifically, the internal clock signal ICLK3 is a signal that controls activation of the data amplifiers 11-1 and 11-2, . . . of the synchronous DRAM device. Therefore, as the synchronous DRAM device is made to have a larger capacity, the number of data amplifiers is raised to consequently make the signal line for the internal clock signal ICLK3 longer. As a result, the number of electrically charging/discharging sources is increased due to the increased load capacity to consequently reduce the life span of the signal line due to electro-migration. Generally, the 50% fault time t50 of the signal line due to the electro-migration can be expressed by the following equation:

$$t50 = a \cdot J^{-2} \cdot \exp(\phi/kT) \tag{1}$$

where
  $\phi = 0.6(eV)$,
  $k = 8.62 \times 10^{-5}(eV/K)$,
  a: a coefficient defined by the signal line,
  J: an absolute average current density $(A/cm^2)$, and
  T: a chip surface temperature (K).
Thus, the life span of the signal line is reduced in proportion to the square of the charging/discharging current of the signal line.

Additionally, the increase in the charging/discharging current results in an increase in the operating current of the synchronous DRAM device to raise the chip temperature in addition to a degraded DC performance which further encourages electro-migration and reduces the life span of the signal line for the internal clock signal ICLK3. Note that the chip surface temperature T can be expressed by the following equation:

$$T = 273.15 + Ta \cdot Vcc \cdot Icc \cdot Rth \tag{2}$$

where
  Ta: an ambient temperature,
  Vcc: a source voltage,
  Icc: an operating current, and
  Rth: a thermal resistance of a package.
Thus, the reduction in the operating current further reduces the life span of the signal line.

While known anti-electro-migration measures include the use of a large signal line or of a plurality of signal lines to reduce the electric current per unit cross-sectional area, i.e., the absolute average current density, such measures increase the chip size and coincidentally the charging/discharging current because of the interlayer capacitance of the signal line. While another known measure is to reduce the load capacitance of the signal line by inserting a buffer into an intermediate portion thereof (see JP-A-2-25068), the total load capacitance including that of the upstream and downstream portions of the buffer is not reduced but rather increased, with such a measure which consequently raises the operating current and the chip temperature.

Figure 5:
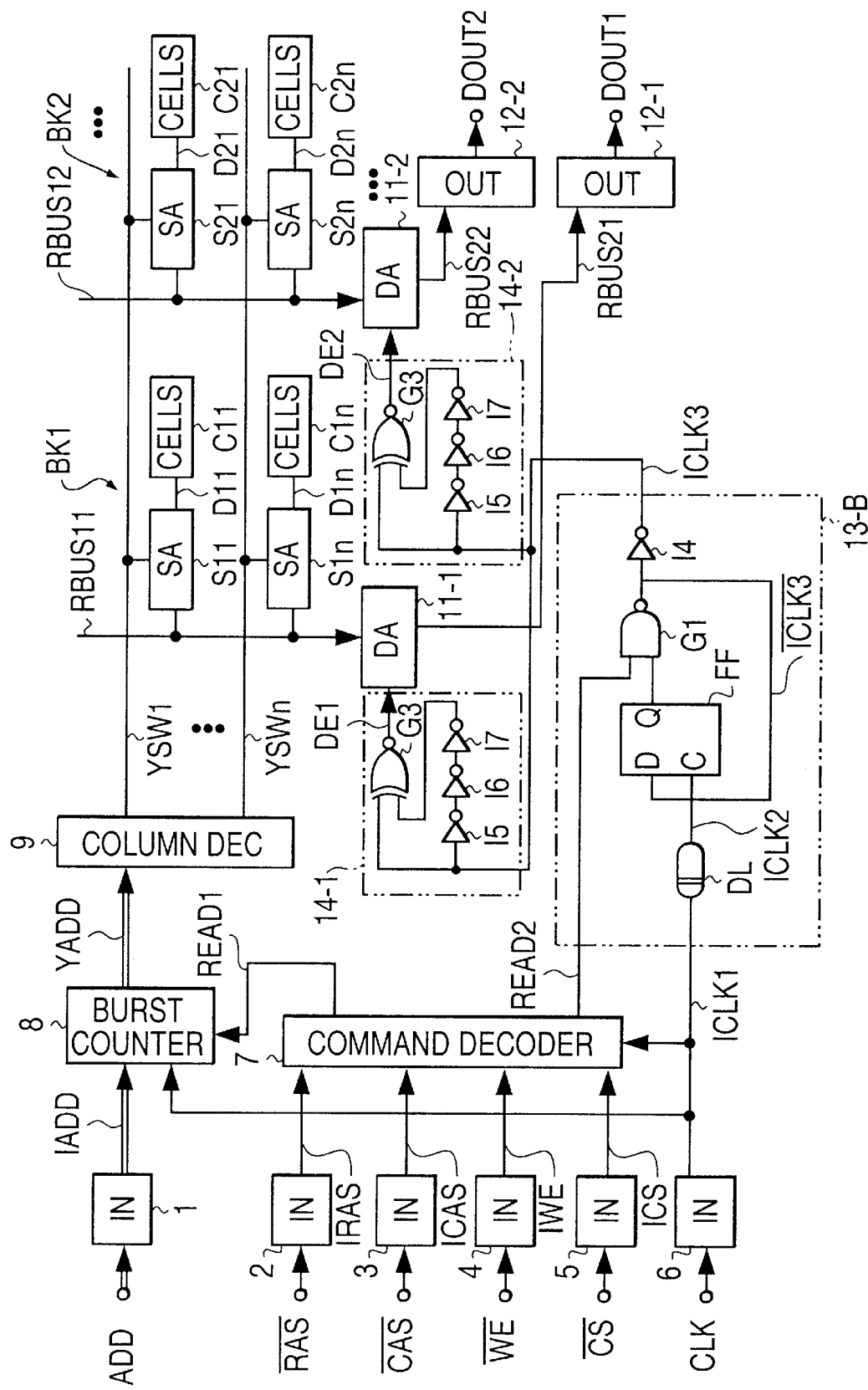
FIG. 5 is a block circuit diagram illustrating a first embodiment of the synchronous DRAM device according to the present invention.

In FIG. 5, which illustrates a first embodiment of the synchronous DRAM device according to the present invention, the internal clock generation circuit 13-A of FIG. 1 is replaced by an internal clock generation circuit 13-B and data amplifier activation signal generation circuits 14-1, 14-2, . . . . The internal clock generation circuit 13-B operates in synchronization with the internal clock signal ICLK1 and outputs the internal clock signal ICLK3 having a frequency equal to ½ of that of the signal ICLK1, whereas the data amplifier activation signal generation circuits 14-1, 14-2, . . . output data amplifier activation signals DE1, DE2, . . . in synchronization with a rising edge and a falling edge of the internal clock signal ICLK3.

The internal clock generation circuit 13-B includes a D-type flip-flop FF in place of the inverters I1, I2 and I3 of the internal clock generation circuit 13-A of FIG. 1. With this arrangement, the output of the NAND circuit G1 is fed back to the D-type flip-flop FF. Therefore, the internal clock generation circuit 13-B is enabled by the signal READ2 and divides the frequency of the internal clock signal ICLK1 (ICLK2) by 2 to produce the internal clock signal ICLK3.

Also, the data amplifier activation signal generation circuits 14-1, 14-2, . . . have the same configuration, and each is formed by inverters I5, I6, I7 and an exclusive NOR circuit G3. Thus, the data amplifier activation generation circuits 14-1, 14-2, . . . generate constant width pulse signals DE1, DE2, . . . respectively at each rising edge and at each falling edge of the internal clock signal ICLK3.

Now, the operation of the synchronous DRAM device of FIG. 5 will be explained with reference to FIGS. 6A through 6P.

Figure 6:
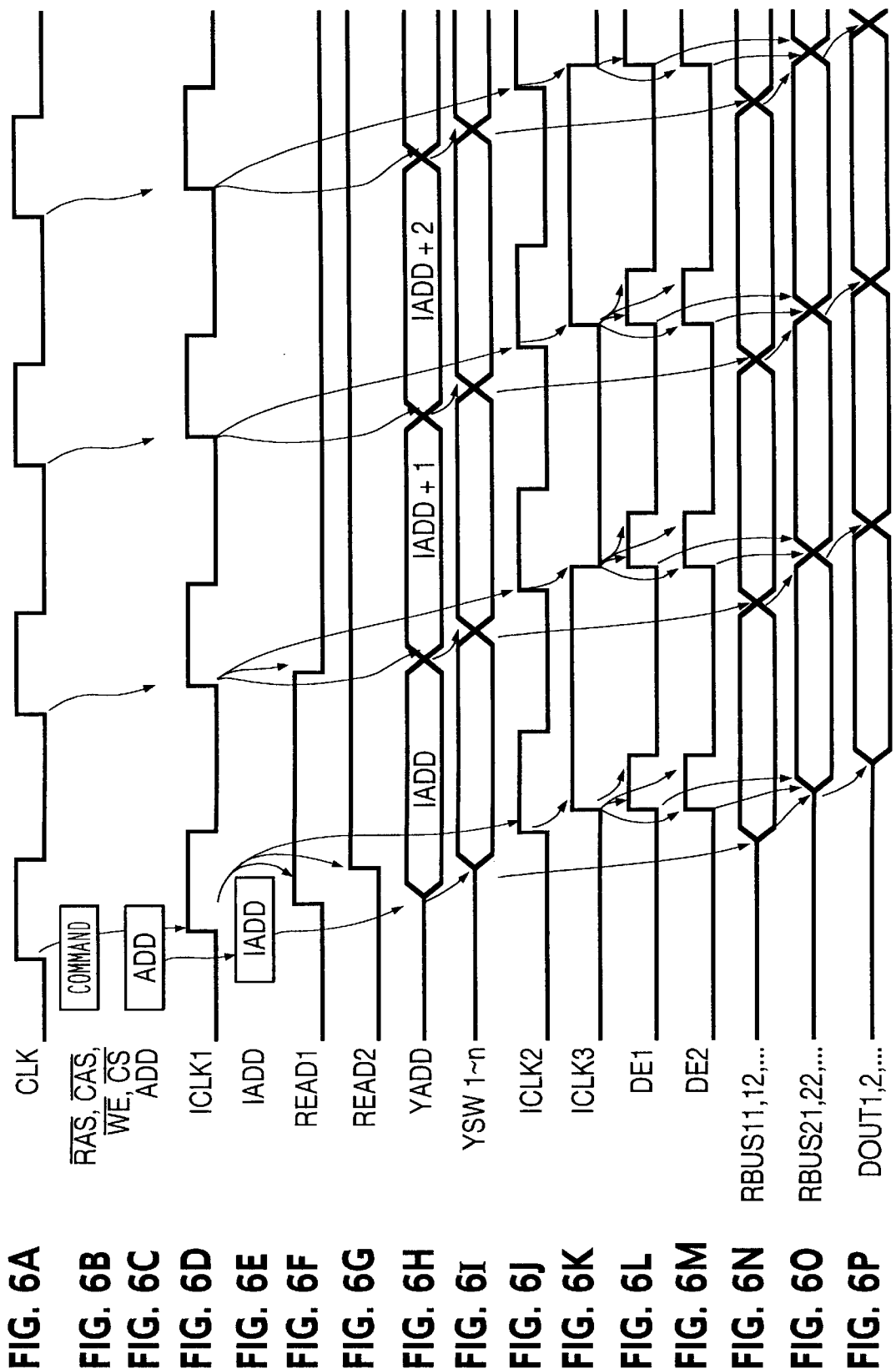
FIGS. 6A through 6P are timing charts for showing the operation of the device of FIG. 5.

Assume again that an external clock signal CLK is input as shown in FIG. 6A and, as a result, signals $\overline{RAS}$, $\overline{CAS}$, $\overline{WE}$ and $\overline{CS}$ are input at a rising edge of the external clock signal CLK to show a read command as shown in FIG. 6B. In this case, as shown in FIG. 6D, an internal clock signal ICLK1 is generated in synchronization with the external clock signal CLK, and also, an external address signal ADD as shown in FIG. 6C becomes an internal address signal IADD as shown in FIG. 6E.

Upon receiving the read command, the command decoder 7 outputs high level signals READ1 and READ2 as shown in FIGS. 6F and 6G in synchronization with the internal clock signal ICLK1. The signal READ1 is brought to a low level in synchronization with the next rising edge of the internal clock signal ICLK1.

Upon receiving the high level signal READ1, the burst counter 8 latches and outputs an internal address signal IADD as shown in FIG. 6H. Thereafter, the signal READ1 goes to a low level, so that the burst counter 8 proceeds to a burst operation, where it generates IADD+1, IADD+2, . . . in synchronization with the internal clock signal ICLK1. More specifically, a column address signal YADD is changed to IADD, IADD+1, IADD+2, . . . and, as a result, the column decoder 9 sequentially selects column switch lines that correspond to IADD, IADD+1, IADD+2, . . . respectively as shown in FIG. 6I. Thus, as shown in FIG. 6N, data are output from the sense amplifiers that have amplified in advance cell data to the read bus RBUS11, RBUs12, . . . .

On the other hand, the internal clock generation circuit 13-B that receives the high level signal READ2 generates an internal clock signal ICLK2 that is synchronized with the internal clock signal ICLK1, as shown in FIG. 6J and outputs internal clock signal ICLK3 that is synchronized only with the rising edge of the internal clock signal ICLK2, as shown in FIG. 6K. Thus, the frequency of the internal clock signal ICLK3 is equal to ½ of that of the internal clock signal ICLK2.

Then, as shown in FIGS. 6L and 6M, the data amplifier activation signals DE1 and DE2 are activated immediately after a rising edge and a falling edge of the internal clock signal ICLK3.

As a result of this, as shown in FIG. 6O, the data on the read bus RBUS11 (12, . . . ) is output to the read bus RBUS21 (22, . . . ) in synchronization with the data amplifier activation signal DE1 (DE2, . . . ). Additionally, as shown in FIG. 6P, the data on the read bus RBUS21 (22, . . . ) is output to the output terminal DOUT1 (DOUT2, . . . ).

Figure 7:
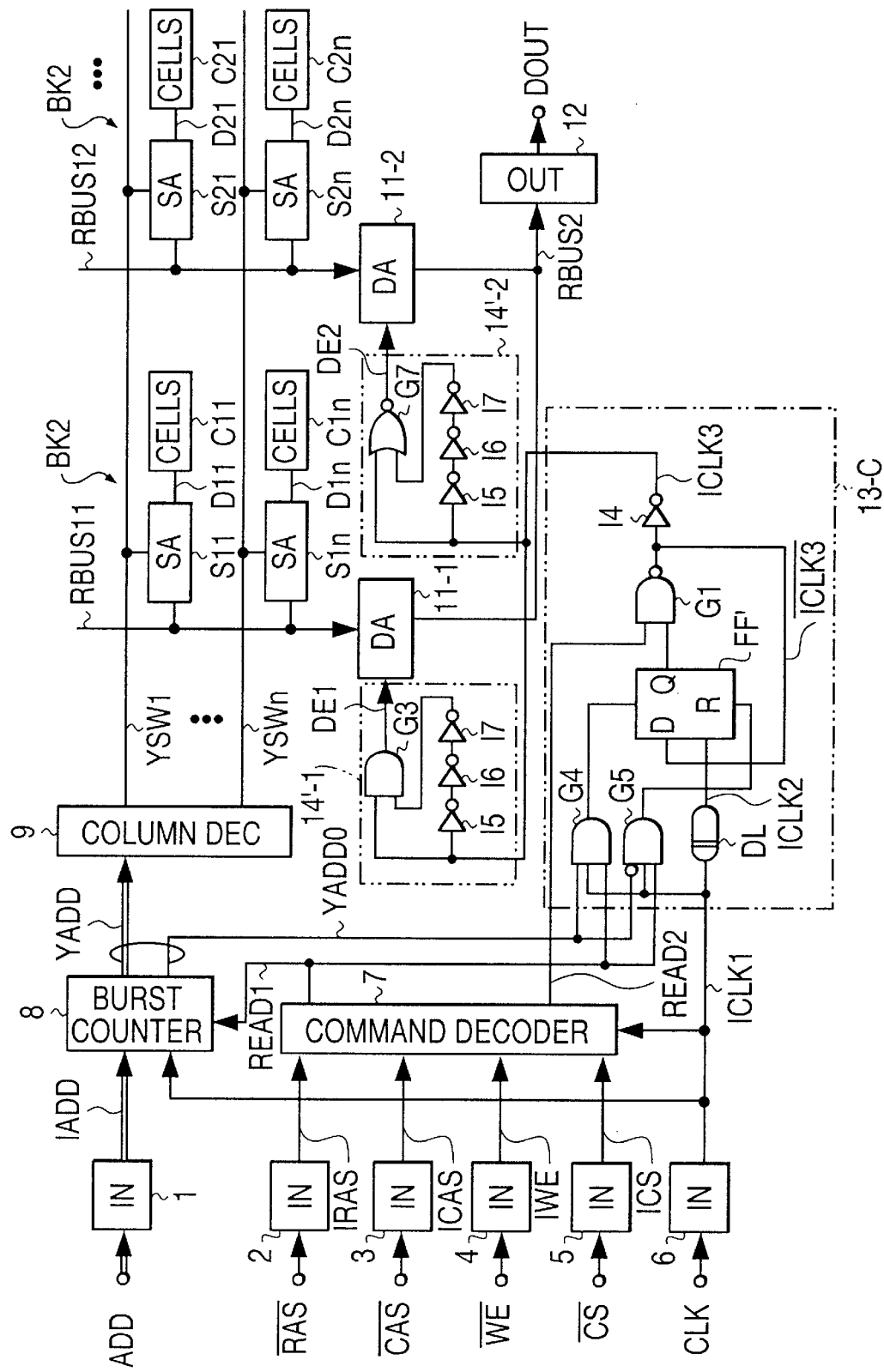
FIG. 7 is a block circuit diagram illustrating a second embodiment of the synchronous DRAM device according to the present invention.

FIG. 7 illustrates a second embodiment of the synchronous DRAM device according to the present invention, and corresponds to the synchronous DRAM device of FIG. 3. In FIG. 7, the internal clock generation circuit 13-B and the data amplifier activation signal generation circuits 14-1, 14-2, . . . of FIG. 5 are replaced by an internal clock generation circuit 13-C and data amplifier activation signal generation circuits 14'-1, 14'-2, . . . . While the internal clock generation circuit 13-C outputs the internal clock signal ICLK3 having a frequency equal to ½ of the internal clock signal ICLK1 in synchronization with the internal clock signal ICLK1, it is set and reset according to the internal clock signal ICLK1, the signal READ1 and the signal YADD0. The data amplifier activation signal generation circuits 14'-1, 14'-2, . . . output respectively data amplifier activation signals DE1, DE2, . . . that are synchronized with either a rising edge or a falling edge of the internal clock signal ICLK3.

The internal clock generation circuit 13-C is formed by a D-type flip-flop FF' having a set/reset function in place of the D-type flip-flop FF of the internal clock generation circuit 13-B of FIG. 5. The D-type flip-flop FF' is set by an AND circuit G4, when the signal READ1 is high, the internal clock signal ICLK1 is high and the signal YADD0 is high. On the other hand, the flip-flop FF' is reset by a gate circuit G5, when the signal READ1 is high, the internal clock signal ICLK1 is high and the signal YADD0 is low. Thus, the internal clock generation circuit 13-C is also enabled by the signal READ2 to divide the frequency of the internal clock signal ICLK1 (ICLK2) by 2 to produce the internal clock signal ICLK3.

The data activation signal generation circuits 14'-1, 14'-2, . . . have configurations that are different from each other. The data amplifier activation signal generation circuit 14'-1 includes an AND circuit G6 in place of the exclusive NOR circuit G3 of the data amplifier activation signal generation circuit 14-1 of FIG. 5, whereas the data amplifier activation signal generation circuit 14'-2 includes a NOR circuit G7 in place of the exclusive NOR circuit G3 of the data amplifier activation signal generation circuit 14-2 in FIG. 5. As a result, the data amplifier activation signal generation circuit 14'-1 generates a constant width pulse signal DE1 at each rising edge of the internal clock signal ICLK3, whereas the data amplifier activation signal generation circuit 14'-2 generates a constant width pulse signal DE2 at each falling edge of the internal clock signal ICLK3.

Now, the operation of the synchronous DRAM device of FIG. 7 will be explained with reference to FIGS. 8A through 8R.

Assume again that an external clock signal CLK is input as shown in FIG. 8A and, as a result, signals RAS, CAS, WE and CS are input at a rising edge of the external clock signal CLK to show a read command as shown in FIG. 8B. In this case, as shown in FIG. 8D, an internal clock signal ICLK1 is generated in synchronization with the external clock signal CLK, and also, an external address signal ADD shown in FIG. 8C becomes an internal address signal IADD as shown in FIG. 8E.

Upon receiving the read command, the command decoder 7 outputs high level signals READ1 and READ2 as shown in FIGS. 8F and 8G in synchronization with the internal clock signal ICLK1. The signal READ1 is brought to a low level in synchronization with the next rising edge of the internal clock signal ICLK1.

Upon receiving the high level signal READ1, the burst counter 8 latches and outputs an internal address signal IADD as shown in FIGS. 8H and 8I. Note that IADD is expressed in terms of (YADD0, YADD1). Thereafter, the signal READ1 goes to a low level, so that the burst counter 8 proceeds to a burst operation, where it generates IADD+1, IADD+2, . . . in synchronization with the internal clock signal ICLK1. Also note that IADD+1, IADD+2, . . . are expressed in terms of (YADD0, YADD1). More specifically, the column address signal YADD is changed to IADD, IADD+1, IADD+2, . . . and, as a result, the column decoder 9 sequentially selects column switch lines that correspond to the addresses of IADD, IADD+1, IADD+2, . . . except for the least significant bit, respectively, as shown in FIG. 8J. Thus, as shown in FIGS. 8O and 8P, data are output from the sense amplifiers that have amplified in advance cell data to the read buses RBUS11, RBUS12, . . . .

On the other hand, in the internal clock generation circuit 13-C that receives the high level signal READ1, the D-type flip-flop FF' is initialized according to the internal clock signal ICLK1 and the signal YADD0. In the case of FIG. 7, both the internal clock signal ICLK1 (FIG. 8D) and the signal YADD0 (FIG. 8H) are high and, therefore, the D-type flip-flop FF' is set.

Then, in the internal clock generation circuit 13-C that receives the high level signal READ2, an internal clock signal ICLK3 is brought to a low level, whereas the internal clock signal ICLK3 goes to a high level HIGH as shown in FIG. 8L. Thereafter, an internal clock signal ICLK2 that is synchronized with the internal clock signal ICLK1 is internally generated as shown in FIG. 8K, and then, an internal clock signal ICLK3 that is synchronized only with a rising edge of the internal clock signal ICLK2 is output, as shown in FIG. 8L. Thus, the frequency of the internal clock signal ICLK3 will be ½ of that of the internal clock signal ICLK2.

As the internal clock signal ICLK2 as shown in FIG. 8L goes from a high level to a low level, all the inputs to the NOR circuit G7 of the data amplifier activation signal generation circuit 14'-2 are held to a low level for a predetermined period of time. As shown in FIG. 8N, the data amplifier activation signal DE2 is held to a high level during this low level period. Note that the low level period is determined by the signal activation time of the inverters I5, I6 and I7 of the data amplifier activation signal generation circuit 14'-2. As the internal clock signal ICLK3 as shown in FIG. 8L moves from a low level to a high level HIGH, all the inputs to the AND circuit G6 of the data amplifier activation signal generation circuit 14'-1 are held to a low level for a predetermined period of time. As shown in FIG. 8M, the data amplifier activation signal DE1 is held to a high level during this low level period. Note that the low level period is determined by the signal activation time of the inverters I5, I6 and I7 of the data amplifier activation signal generation circuit 14'-1.

Thus, as shown in FIGS. 8M and 8N, one of the data amplifier activation signals DE1 and DE2 is activated immediately after either a rising edge or a falling edge of the internal clock signal ICLK3. As a result, as shown in FIG. 8Q, the data on the read bus RBUS11 (12) is output to the read bus RBUS2 in synchronization with the data amplifier activation signal DE1 (DE2). Additionally, as shown in FIG. 8R, the data on the read bus RBUS2 is output to the output terminal DOUT.

In the above-described embodiments, while the internal clock generation circuits 13-B and 13-C are designed to respond to a rising edge of the external clock signal CLK, the internal clock generation circuits 13-B and 13-C may alternatively be so designed as to respond to a falling edge of the external clock signal CLK.

As described above with the above-described embodiments, the frequency of the internal clock signal ICLK2 is divided into halves so that the average current flowing through the signal line for the internal clock signal ICLK3 will be about half of its counterpart of the comparable prior art devices. Also, the average current J flowing per unit cross-sectional area of the signal line can be about half of its counterpart. Therefore, the 50% fault time t50' due to electro-migration will show an improvement of four times as expressed by the following formula using equation (1) above and the prior art 50% fault time t50.

$$t50'/t50 = (1/2)^{-2}$$
$$= 4$$

Since the reduction of the average current per unit time effectively suppresses the temperature rise of the chip, the electro-migration can be further suppressed.

As explained above, the present invention can effectively prevent any reduction in the life span of signal lines due to electro-migration, and hence can improve the reliability of the device.

What is claimed is:

1. A semiconductor device comprising: an internal clock generation circuit for generating an internal clock signal adapted to transit from a first level to a second level in response to a rising edge of an external clock signal and from said second level to said first level in response to the next rising edge of said external clock signal;

first and second internal circuits having the same function;

a first trigger circuit, connected between said internal clock generation circuit and said first internal circuit, for using one level transition of said internal clock signal from said first level to said second level to generate one first trigger pulse signal for triggering said first internal circuit; and a second trigger circuit, connected between said internal clock generation circuit and said second internal circuit, for using one level transition of said internal clock signal from said second level to said first level to generate one second trigger pulse signal for triggering said second internal circuit.

2. A semiconductor device comprising:

an internal clock generation circuit for generating an internal clock signal adapted to transit from a first level to a second level in response to a rising edge of an external clock signal and from said second level to said first level in response to the next rising edge of said external clock signal;

first and second internal circuits having the same function;

a first trigger circuit, connected between said internal clock generation circuit and said first internal circuit, for using one level transition of said internal clock signal from said first level to said second level to generate one first trigger pulse signal for triggering said first internal circuit; and a second trigger circuit, connected between said internal clock generation circuit and said second internal circuit, for using one level transition of said internal clock signal from said second level to said first level to generate one second trigger pulse signal for triggering said second internal circuit.

3. A semiconductor device comprising:

an internal clock generation circuit for generating an internal clock signal adapted to transit from a first level to a second level in response to a falling edge of an external clock signal and from said second level to said first level in response to the next falling edge of said external clock signal;

first and second internal circuits having the same function;

a first trigger circuit, connected between said internal clock generation circuit and said first internal circuit, for using a level transition of said internal clock signal from said first level to said second level to generate one first trigger pulse signal for triggering said first internal circuit; and a second trigger circuit, connected between said internal clock generation circuit and said second internal circuit, for using one level transition of said internal clock signal from said second level to said first level to generate one second trigger pulse signal for triggering said second internal circuit.

* * * * *